US012360175B1

(12) United States Patent
Zanbaghi et al.

(10) Patent No.: US 12,360,175 B1
(45) Date of Patent: Jul. 15, 2025

(54) DRIVER STAGE SHORT CIRCUIT DETECTION

(71) Applicant: Cirrus Logic International Semiconductor Ltd., Edinburgh (GB)

(72) Inventors: Ramin Zanbaghi, Austin, TX (US); Kim Huynh, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 952 days.

(21) Appl. No.: 17/496,220

(22) Filed: Oct. 7, 2021

(51) Int. Cl.
*H03F 3/217* (2006.01)
*G01R 19/155* (2006.01)
*G01R 31/52* (2020.01)

(52) U.S. Cl.
CPC ........... *G01R 31/52* (2020.01); *G01R 19/155* (2013.01); *H03F 3/217* (2013.01)

(58) Field of Classification Search
CPC ........ H03F 3/217; G01R 31/52; G01R 19/155
USPC ................................. 330/251, 10, 207 P, 298
See application file for complete search history.

(56) References Cited

U.S. PATENT DOCUMENTS 7,157,968 B2 * 1/2007 Shin ........................ H03F 1/523
330/251

* cited by examiner

*Primary Examiner* — Andrea Lindgren Baltzell
*Assistant Examiner* — Khiem D Nguyen
(74) *Attorney, Agent, or Firm* — Jackson Walker L.L.P.

(57) ABSTRACT

A system may include a Class-D stage comprising a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal. The system may also include current sensing circuitry comprising a plurality of sensors, each sensor configured to sense a current associated with a respective one of the first high-side switch, second high-side switch, first low-side switch, and second low-side switch. The system may also include short-circuit detection circuitry configured to determine a presence and a location of a short circuit in the Class-D stage based on the sensed currents.

20 Claims, 6 Drawing Sheets

DRIVER STAGE SHORT CIRCUIT DETECTION

FIELD OF DISCLOSURE

The present disclosure relates in general to circuits for audio devices, piezoelectric devices, and/or haptic-feedback devices, including without limitation the implementation of such circuits within personal audio devices such as wireless telephones, media players, and mobile devices, and more specifically, to a circuit topology for sensing current in a full-bridge driver.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones, one or more speakers, a piezoelectric transducer, a haptic feedback transducer, and/or other transducer. Such circuitry often includes a driver including a power amplifier for driving a transducer output signal to the transducer. Oftentimes, a power converter may be used to provide a supply voltage to a power amplifier in order to amplify a signal driven to speakers, headphones, piezoelectric transducers, haptic feedback transducers, or other transducers.

Figure 1:
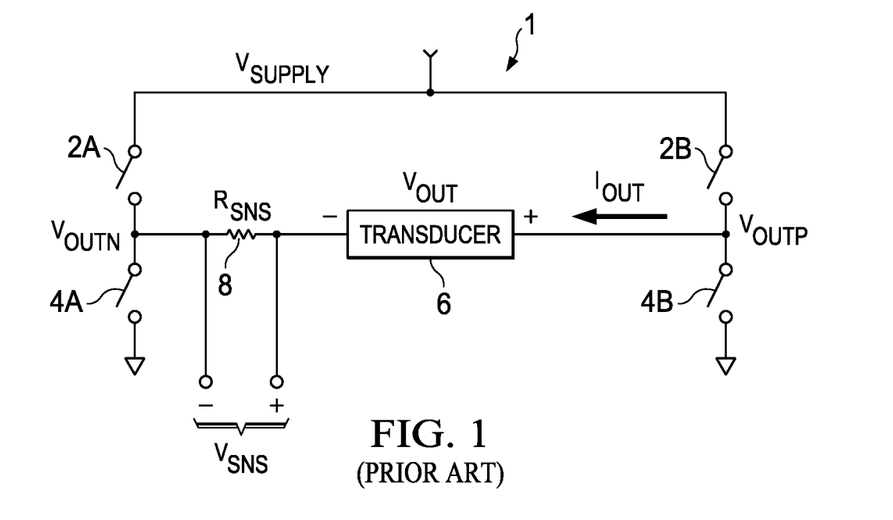
FIG. 1 illustrates an example circuit topology for a Class-D driver and transducer, as is known in the prior art.

In many of such devices, a transducer may be driven with a Class-D driver stage, which may also be known as an H-bridge driver. FIG. 1 depicts an example of a Class-D driver stage 1 as is known in the art, having a voltage supply $V_{SUPPLY}$, high-side driver switches 2 (e.g., high-side driver switches 2A and 2B), low-side driver switches 4 (e.g., low-side driver switches 4A and 4B), and a current sense resistor 8 having a resistance $R_{SNS}$. In operation, switches 2 and 4 may be commutated by pulse-width modulated signals to drive a desired output voltage $V_{OUT}$ (e.g., $V_{OUT}=V_{OUTP}-V_{OUTN}$) to transducer 6, causing an output current $I_{OUT}$ through transducer 6. A sense voltage $V_{SNS}$ may exist across sense resistor 8 equal to the product of output current $I_{OUT}$ and resistance $R_{SNS}$. Because sense voltage $V_{SNS}$ is linearly proportional to output current $I_{OUT}$, sense voltage $V_{SNS}$ may be indicative of output current $I_{OUT}$, and may thus be used by measurement circuitry, control circuitry, and/or other circuitry of a device comprising driver stage 1 and transducer 6 as a quantity representative of output current $I_{OUT}$.

While the topology depicted in FIG. 1 allows for sense resistor 8 to sense the complete output current $I_{OUT}$ through transducer 6, such topology does have disadvantages. For example, the topology shown in FIG. 1 may not be a feasible approach to detect a short circuit between voltage node $V_{OUTP}$ and ground when high-side driver switch 2B and low-side driver switch 4A are closed because in such scenario, the short circuit current may flow predominantly through high-side driver switch 2B and the short circuit, and not through current sense resistor 8. Similarly, the topology shown in FIG. 1 may not be a feasible approach to detect a short circuit between voltage node $V_{OUTN}$ and ground when high-side driver switch 2A and low-side driver switch 4B are closed because in such scenario, the short circuit current may flow predominantly through high-side driver switch 2A and the short circuit, and not through current sense resistor 8.

As another example, the topology shown in FIG. 1 may not be a feasible approach to detect a short circuit between voltage node $V_{OUTP}$ and supply voltage $V_{SUPPLY}$ when high-side driver switch 2A and low-side driver switch 4B are closed because in such scenario, the short circuit current may flow predominantly through low-side driver switch 4B and the short circuit, and not through current sense resistor 8. Similarly, the topology shown in FIG. 1 may not be a feasible approach to detect a short circuit between voltage node $V_{OUTN}$ and supply voltage $V_{SUPPLY}$ when high-side driver switch 2B and low-side driver switch 4A are closed because in such scenario, the short circuit current may flow predominantly through low-side driver switch 4A and the short circuit, and not through current sense resistor 8.

SUMMARY

In accordance with the teachings of the present disclosure, one or more disadvantages and problems associated with existing approaches to detecting a short circuit in a Class-D output stage may be reduced or eliminated.

In accordance with embodiments of the present disclosure, a system may include a Class-D stage, current-sensing circuitry, and short-circuit detection circuitry. The Class-D stage may include a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal. The current-sensing circuitry may include a first sensor coupled to the first high-side switch and configured to sense a first sense current associated with the first high-side switch, such that an output current through a load coupled between the first output terminal and the second output terminal is proportional to the first sense current when the first high-side switch is activated; a second sensor coupled to the second high-side switch and configured to sense a second sense current associated with the second high-side switch, such that the output current is proportional to the second sense current when the second high-side switch is activated; a third sensor coupled to the first low-side switch and configured to sense a third sense current associated with the first low-side switch, such that the output current is proportional to the third sense current when the first low-side switch is activated; and a fourth sensor coupled to the second low-side switch and configured to sense a fourth sense current associated with the second low-side switch, such that the output current is proportional to the fourth sense current when the second low-side switch is activated. The short-circuit detection circuitry may be configured to determine a presence and a location of a short circuit in the Class-D stage based on the first sense voltage, the second sense voltage, the third sense voltage, and the fourth sense voltage.

In accordance with these and other embodiments of the present disclosure, a method may be provided for use in a system comprising a Class-D stage having a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal. The method may include measuring a first sense current associated with the first high-side switch with a first sensor coupled to the first high-side switch, such that an output current through a load coupled between the first output terminal and the second output terminal is proportional to the first sense current when the first high-side switch is activated, measuring a second sense current associated with the second high-side switch with a second sensor coupled to the second high-side switch, such that the output current is proportional to the second sense current when the second high-side switch is activated, measuring a third sense current associated with the first low-side switch with a third sensor coupled to the first low-side switch, such that the output current is proportional to the third sense current when the first low-side switch is activated, measuring a fourth sense current associated with the second low-side switch with a fourth sensor coupled to the second low-side switch, such that the output current is proportional to the fourth sense current when the second low-side switch is activated, and determining a presence and a location of a short circuit in the Class-D stage based on the first sense voltage, the second sense voltage, the third sense voltage, and the fourth sense voltage.

In accordance with these and other embodiments of the present disclosure, a device may include an output transducer; a Class-D stage coupled to the output transducer via a first output terminal and a second output terminal of the Class-D stage and configured to drive the output transducer, current sensing circuitry, and short-circuit detection circuitry. The Class-D stage may include a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal. The current sensing circuitry may include a first sensor coupled to the first high-side switch and configured to sense a first sense current associated with the first high-side switch, such that an output current through a load coupled between the first output terminal and the second output terminal is proportional to the first sense current when the first high-side switch is activated; a second sensor coupled to the second high-side switch and configured to sense a second sense current associated with the second high-side switch, such that the output current is proportional to the second sense current when the second high-side switch is activated; a third sensor coupled to the first low-side switch and configured to sense a third sense current associated with the first low-side switch, such that the output current is proportional to the third sense current when the first low-side switch is activated; and a fourth sensor coupled to the second low-side switch and configured to sense a fourth sense current associated with the second low-side switch, such that the output current is proportional to the fourth sense current when the second low-side switch is activated. The short-circuit detection circuitry may be configured to determine a presence and a location of a short circuit in the Class-D stage based on the first sense voltage, the second sense voltage, the third sense voltage, and the fourth sense voltage.

In accordance with these and other embodiments of the present disclosure, a system may be provided for detecting a short circuit in a Class-D stage comprising a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal. The system may include current sensing circuitry and short-circuit detection circuitry. The current sensing circuitry may include a first sensor coupled to the first high-side switch and configured to sense a first sense current associated with the first high-side switch, such that an output current through a load coupled between the first output terminal and the second output terminal is proportional to the first sense current when the first high-side switch is activated; a second sensor coupled to the second high-side switch and configured to sense a second sense current associated with the second high-side switch, such that the output current is proportional to the second sense current when the second high-side switch is activated; a third sensor coupled to the first low-side switch and configured to sense a third sense current associated with the first low-side switch, such that the output current is proportional to the third sense current when the first low-side switch is activated; and a fourth sensor coupled to the second low-side switch and configured to sense a fourth sense current associated with the second low-side switch, such that the output current is proportional to the fourth sense current when the second low-side switch is activated. The short-circuit detection circuitry may be configured to determine a presence and a location of a short circuit in the Class-D stage based on the first sense voltage, the second sense voltage, the third sense voltage, and the fourth sense voltage.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 2:
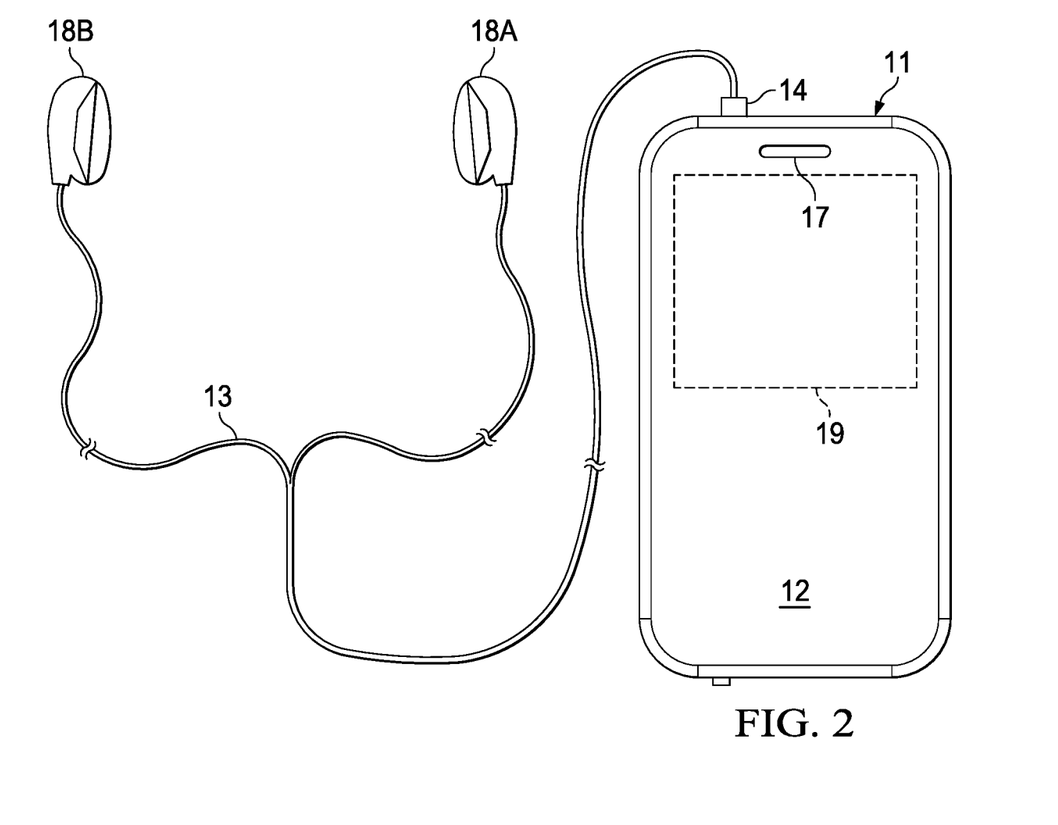
FIG. 2 illustrates an example personal mobile device, in accordance with embodiments of the present disclosure.

FIG. 2 illustrates an example personal mobile device 11, in accordance with embodiments of the present disclosure. FIG. 2 depicts personal mobile device 11 having a speaker 17. Speaker 17 is merely an example, and it is understood that personal mobile device 11 may be used in connection with a variety of transducers including magnetic coil loudspeakers, piezo speakers, haptic feedback transducers, and others. In addition or alternatively, personal mobile device 11 may be coupled to a headset 13 in the form of a pair of earbud speakers 18A and 18B. Headset 13 depicted in FIG. 2 is merely an example, and it is understood that personal mobile device 11 may be used in connection with a variety of audio transducers, including without limitation, headphones, earbuds, in-ear earphones, and external speakers. A plug 14 may provide for connection of headset 13 to an electrical terminal of personal mobile device 11. Personal mobile device 11 may provide a display to a user and receive user input using a touch screen 12, or alternatively, a standard liquid crystal display (LCD) may be combined with various buttons, sliders, and/or dials disposed on the face and/or sides of personal mobile device 11. As also shown in FIG. 2, personal mobile device 11 may include an integrated circuit (IC) 19 for generating an analog signal for transmission to speaker 17, headset 13, and/or another transducer.

Figure 3:
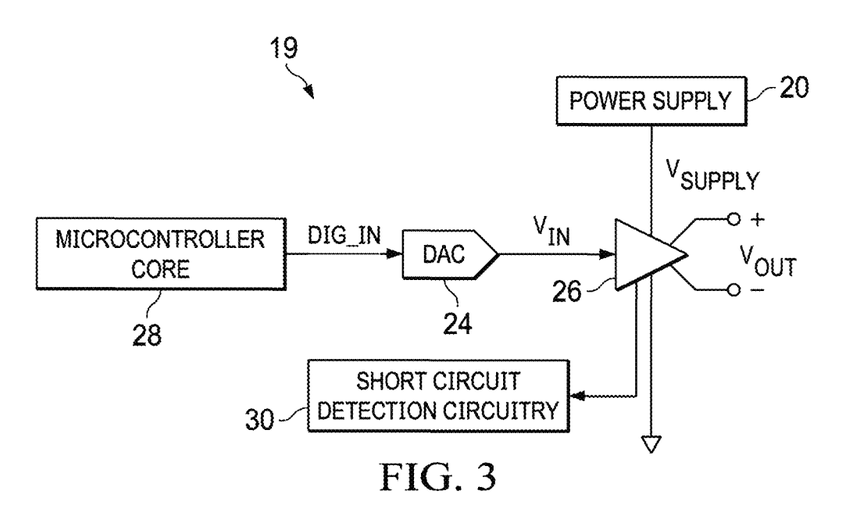
FIG. 3 illustrates a block diagram of selected components of an example integrated circuit of a personal mobile device for driving a transducer, in accordance with embodiments of the present disclosure.

FIG. 3 illustrates a block diagram of selected components of an example IC 19 of a personal mobile device for driving a transducer, in accordance with embodiments of the present disclosure. As shown in FIG. 3, a microcontroller core 28 may supply a digital input signal DIG_IN to a digital-to-analog converter (DAC) 24, which may convert the digital input signal to an analog input signal $V_{IN}$. In some embodiments, analog signal $V_{IN}$ may comprise a pulse-width modulated signal. In addition, although analog signal $V_{IN}$ is shown in FIG. 3 as a single-ended signal, in some embodiments analog signal $V_{IN}$ may comprise a differential signal. DAC 24 may supply analog signal $V_{IN}$ to an amplifier 26 which may amplify or attenuate analog input signal $V_{IN}$ to provide a differential output signal $V_{OUT}$, which may operate a speaker, a headphone transducer, a piezoelectric transducer, a haptic feedback transducer, a line level signal output, and/or other suitable output. In some embodiments, DAC 24 may be an integral component of amplifier 26, particularly in embodiments in which analog input signal $V_{IN}$ is a pulse-width modulated signal for driving switches of amplifier 26. In these and other embodiments, amplifier 26 may comprise a Class-D driver stage. A power supply 20 may provide the power supply rail inputs of amplifier 26.

As also depicted in FIG. 3, IC 19 may also include short-circuit detection circuitry 30. Short-circuit detection circuitry 30 may comprise any suitable system, device, or apparatus configured to receive one or more signals indicative of a physical quantity associated with amplifier 26 (e.g., an electrical current flowing within amplifier 26) and based thereon, determine if a short circuit condition exists within amplifier 26.

Although FIGS. 2 and 3 contemplate that IC 19 resides in a personal mobile device, systems and methods described herein may also be applied to electrical and electronic systems and devices other than a personal mobile device, including transducer systems for use in a computing device larger than a personal mobile device, such as an automobile, a building, or other structure.

Figure 4:
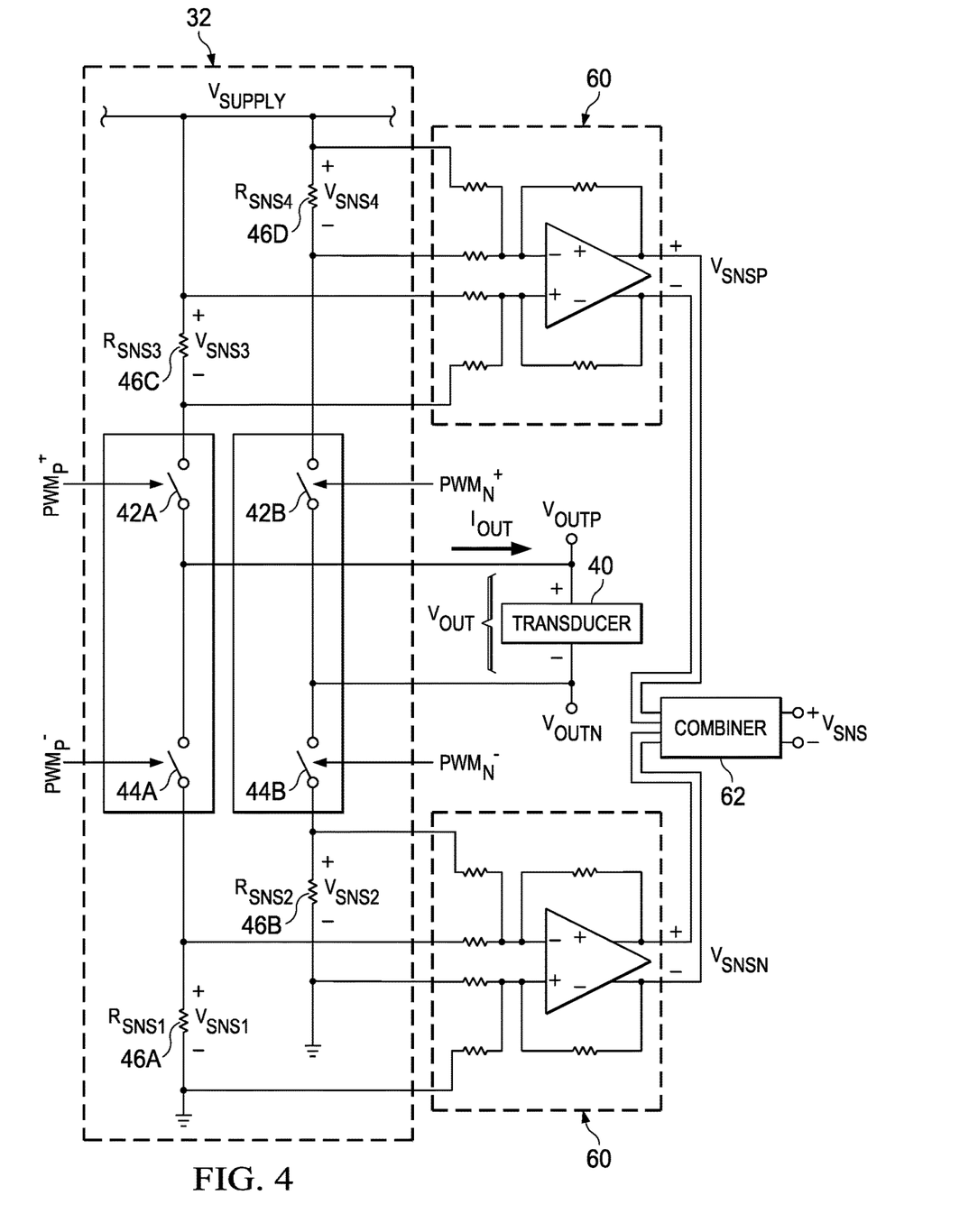
FIG. 4 illustrates a block and circuit diagram of selected components of an example Class-D stage, analog front ends, and a combiner that may be used to implement short-circuit detection circuitry, in accordance with embodiments of the present disclosure.

FIG. 4 illustrates a block and circuit diagram of selected components of an example Class-D stage 32 (e.g., output driver stage of Class-D stage 32), analog front ends (AFEs) 60 and combiner 62 that may be used to implement short-circuit detection circuitry 30, in accordance with embodiments of the present disclosure. In some embodiments, Class-D stage 32 may implement all or a portion of amplifier 26 described with respect to FIG. 3.

As shown in FIG. 4, Class-D stage 32 may drive output voltage $V_{OUT}$ (e.g., $V_{OUT}=V_{OUTP}-V_{OUTN}$, where $V_{OUTP}$ and $V_{OUTN}$ are a positive-terminal output voltage and a negative-terminal output voltage, respectively) to transducer 40 and include a high-side switch 42A coupled (via sense resistor 46C) to supply voltage $V_{SUPPLY}$ and a low-side switch 44A coupled (via sense resistor 46A) to ground for driving a positive polarity output of Class-D stage 32. High-side switch 42A and low-side switch 44A may be controlled by complementary pulse-width modulation signals $PWM_P^+$ and $PWM_P^-$, respectively. Class-D stage 32 may also include a high-side switch 42B coupled (via sense resistor 46D) to supply voltage $V_{SUPPLY}$ and a low-side switch 44B coupled (via sense resistor 46B) to ground for driving a negative polarity output of Class-D stage 32. High-side switch 42B and low-side switch 44B may be controlled by complementary pulse-width modulation signals $PWM_N^+$ and $PWM_N^-$, respectively.

In normal operation of Class-D stage 32 (e.g., in the absence of a short circuit), when low-side switch 44A is activated (e.g., on, closed, enabled), a sense voltage $V_{SNS1}$ may form across sense resistor 46A which is negative and equal in magnitude to the product of output current $I_{OUT}$ through transducer 40 and resistance $R_{SNS1}$ of sense resistor 46A. Likewise, when low-side switch 44B is activated (e.g., on, closed, enabled), a sense voltage $V_{SNS2}$ may form across sense resistor 46B which is equal to the product of output current $I_{OUT}$ through transducer 40 and resistance $R_{SNS2}$ of sense resistor 46B. Further, when high-side switch 42A is activated (e.g., on, closed, enabled), a sense voltage $V_{SNS3}$ may form across sense resistor 46C which is negative and equal in magnitude to the product of output current $I_{OUT}$ through transducer 40 and resistance $R_{SNS3}$ of sense resistor 46C. Moreover, when high-side switch 42B is activated (e.g., on, closed, enabled), a sense voltage $V_{SNS4}$ may form across sense resistor 46D which is equal to the product of output current $I_{OUT}$ through transducer 40 and resistance $R_{SNS4}$ of sense resistor 46D. Thus, in all of these cases, the sense voltages $V_{SNS1}$, $V_{SNS2}$, $V_{SNS3}$, and $V_{SNS4}$ may each be proportional to output current $I_{OUT}$, and thus may be indicative of output current $I_{OUT}$.

As shown in FIG. 4, one AFE 60 may generate a differential output voltage $V_{SNSN}$ which is an amplified version of the difference between sense voltages $V_{SNS1}$ and $V_{SNS2}$, while another AFE 60 may generate a differential output voltage $V_{SNSP}$ which is an amplified version of the difference between sense voltages $V_{SNS3}$ and $V_{SNS4}$. Accordingly, combiner 62 may sum differential output voltage $V_{SNSN}$ and differential output voltage $V_{SNSP}$ to generate sensed voltage $V_{SNS}$ indicative of output current $I_{OUT}$. In some embodiments, short-circuit detection circuitry 30 may include additional components other than AFEs 60 and combiner 62 not explicitly shown in FIG. 4, including, without limitation, filters (e.g., anti-aliasing filters), an analog-to-digital converter, and/or other components.

When a short circuit is present in Class-D stage 32, short-circuit detection circuit 30 (e.g., comprising AFEs 60 and combiner 62) may be configured to detect the existence and location of such short circuit, as described in greater detail below.

Figure 5:
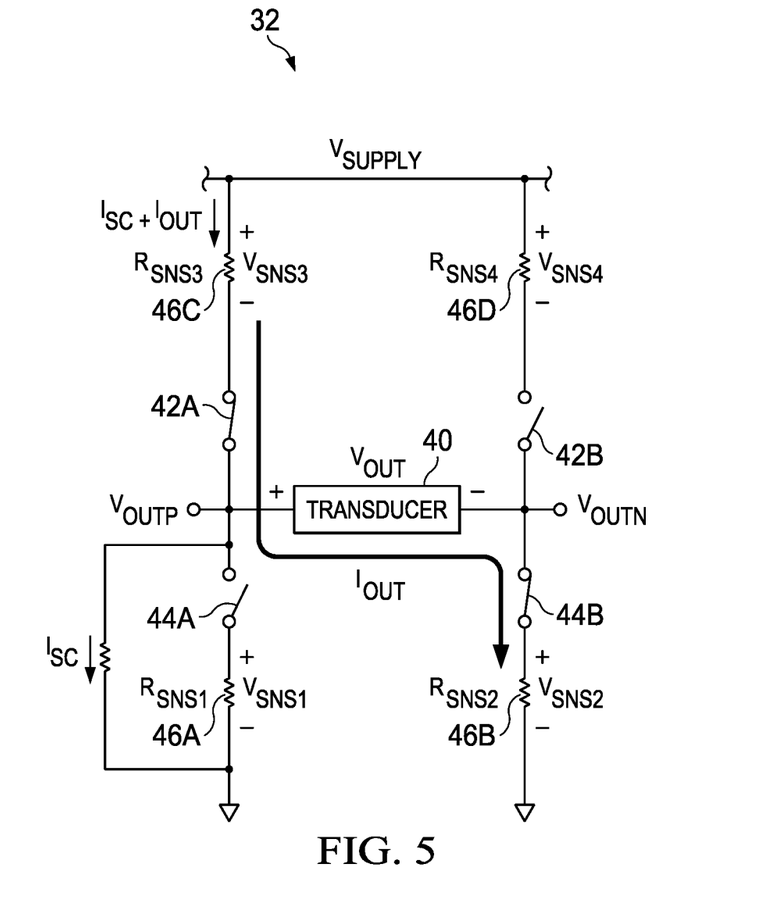
FIG. 5 depicts a Class-D amplifier in an example phase of its switches for a positive output current but with a short circuit between a positive-terminal output voltage of the Class-D amplifier and ground, in accordance with embodiments of the present disclosure.

FIG. 5 depicts Class-D stage 32 in an example phase of its switches for a positive output current $I_{OUT}$ but with a short circuit between positive-terminal output voltage $V_{OUTP}$ of Class-D stage 32 and ground, in accordance with embodiments of the present disclosure. As shown in FIG. 5, in presence of the short circuit between positive-terminal output voltage $V_{OUTP}$ of Class-D stage 32 and ground, a short-circuit current $I_{SC}$ may flow from positive-terminal output voltage $V_{OUTP}$ of Class-D stage 32 to ground. Thus, in accordance with Kerchoff's current law, a current equal to the sum of short-circuit current $I_{SC}$ and output current $I_{OUT}$ may flow through closed high-side switch 42A and sense resistor 46C, generating a sense voltage $V_{SNS3}$ proportional to the sum $I_{SC}+I_{OUT}$. Because short-circuit current $I_{SC}$ may be orders of magnitude greater than output current $I_{OUT}$, the presence of an abnormally large sense voltage $V_{SNS3}$ (e.g., larger than an expected maximum for sense voltage $V_{SNS3}$ in the absence of a short circuit) may thus indicate a presence of a short circuit between positive-terminal output voltage $V_{OUTP}$ of Class-D stage 32 and ground. For example, abnormally large sense voltage $V_{SNS3}$ may indicate a presence of a short circuit between positive-terminal output voltage $V_{OUTP}$ of Class-D stage 32 and ground. Likewise: (a) the presence of an abnormally large sense voltage $V_{SNS1}$ may indicate a presence of a short circuit between positive-terminal output voltage $V_{OUTP}$ of Class-D stage 32 and supply voltage $V_{SUPPLY}$; (b) the presence of an abnormally large sense voltage $V_{SNS2}$ may indicate a presence of a short circuit between negative-terminal output voltage $V_{OUTN}$ of Class-D stage 32 and supply voltage $V_{SUPPLY}$; and (c) the presence of an abnormally large sense voltage $V_{SNS4}$ may indicate a presence of a short circuit between negative-terminal output voltage $V_{OUTN}$ of Class-D stage 32 and ground. Further: (a) the presence of an abnormally large positive differential output voltage $V_{SNSP}$ may indicate a presence of a short circuit between positive-terminal output voltage $V_{OUTP}$ of Class-D stage 32 and ground; (b) the presence of an abnormally large negative differential output voltage $V_{SNSP}$ may indicate a presence of a short circuit between negative-terminal output voltage $V_{OUTN}$ of Class-D stage 32 and ground; (c) the presence of an abnormally large positive differential output voltage $V_{SNSN}$ may indicate a presence of a short circuit between negative-terminal output voltage $V_{OUTN}$ of Class-D stage 32 and supply voltage $V_{SUPPLY}$; and (d) the presence of an abnormally large negative differential output voltage $V_{SNSN}$ may indicate a presence of a short circuit between negative-terminal output voltage $V_{OUTN}$ of Class-D stage 32 and ground. The table below sets forth these relationships between the presence of abnormally large sense voltages and the presence of short circuits.

| Sense Voltage | Short circuit from: | | | |
|---|---|---|---|---|
| | $V_{OUTP}$ to Ground | $V_{OUTN}$ to Ground | $V_{OUTP}$ to $V_{SUPPLY}$ | $V_{OUTN}$ to $V_{SUPPLY}$ |
| $V_{SNS1}$ | — | — | $R_{SNS}(I_{OUT}+I_{SC})$ | — |
| $V_{SNS2}$ | — | — | — | $R_{SNS}(I_{OUT}+I_{SC})$ |
| $V_{SNSN}$ | — | — | $R_{SNS}(I_{OUT}+I_{SC})$ | $-R_{SNS}(I_{OUT}+I_{SC})$ |
| $V_{SNS3}$ | $R_{SNS}(I_{OUT}+I_{SC})$ | — | — | — |
| $V_{SNS4}$ | — | $R_{SNS}(I_{OUT}+I_{SC})$ | — | — |
| $V_{SNSP}$ | $R_{SNS}(I_{OUT}+I_{SC})$ | $-R_{SNS}(I_{OUT}+I_{SC})$ | — | — |

Notably, the table above assumes $R_{SNS}=R_{SNS1}=R_{SNS2}=R_{SNS3}=R_{SNS4}$.

Thus, in accordance with the foregoing, short-circuit detection circuit 30 may be able to detect both the presence and location based on one or more of sense voltages $V_{SNS1}$, $V_{SNS2}$, $V_{SNS3}$, $V_{SNS4}$, $V_{SNSP}$, and $V_{SNSN}$.

Figure 6:
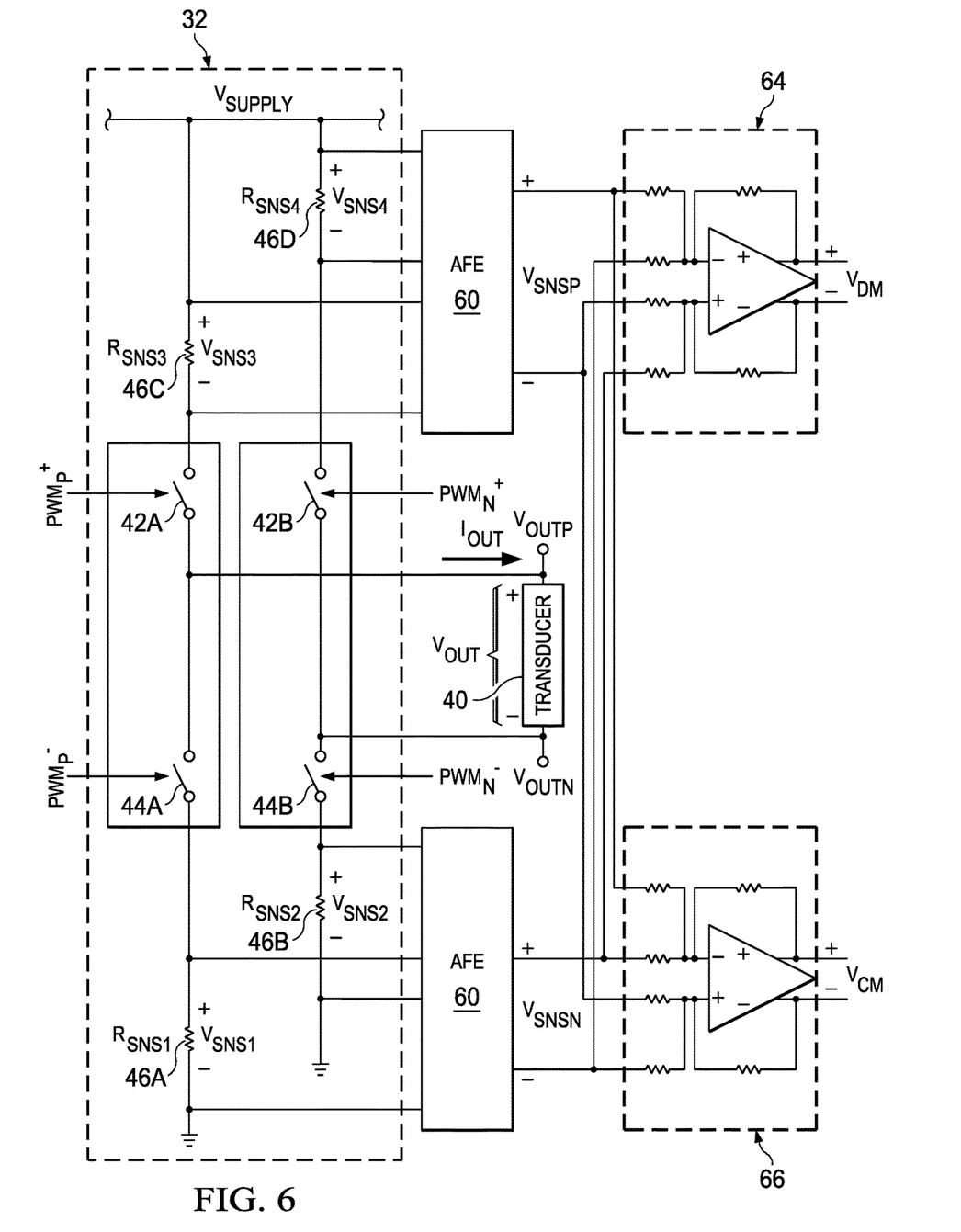
FIG. 6 illustrates a block and circuit diagram of selected components of an example Class-D stage, analog front ends, and combiners that may be used to implement short-circuit detection circuitry, in accordance with embodiments of the present disclosure.

FIG. 6 illustrates a block and circuit diagram of selected components of an example Class-D stage 32, analog front ends 60, and combiners 64 and 66 that may be used to implement short-circuit detection circuitry 30, in accordance with embodiments of the present disclosure. As shown in FIG. 6, the architecture shown in FIG. 6 may be similar in many respects to the architecture shown in FIG. 4, except that in FIG. 6, differential-mode combiner 64 and common-mode combiner 66 are used in lieu of combiner 62. In operation, differential-mode combiner 64 may generate a differential-mode voltage $V_{DM}$ wherein $V_{DM}=V_{SNSP}-V_{SNSN}$ while common-mode combiner 66 may generate a common-mode voltage $V_{CM}$ wherein $V_{CM}=V_{SNSP}+V_{SNSN}$. Short-circuit detection circuit 30 may be able to detect both the presence and location based on differential-mode voltage $V_{DM}$ and common-mode voltage $V_{CM}$, as weak short circuit events may be detected via the common-mode channel, and a location of a short circuit event may be discerned from both the differential-mode channel and the common-mode channel. The table below expands the table above and sets forth these relationships between the presence of abnormally large sense voltages, differential-mode voltage $V_{DM}$, common-mode voltage $V_{CM}$, and the presence of short circuits.

As can be seen from the table below: (a) the presence of an abnormally large positive differential-mode voltage $V_{DM}$ and an abnormally large positive common-mode voltage $V_{CM}$ may indicate a presence of a short circuit between positive-terminal output voltage $V_{OUTP}$ of Class-D stage 32 and ground; (b) the presence of an abnormally large negative differential-mode voltage $V_{DM}$ and an abnormally large negative common-mode voltage $V_{CM}$ may indicate a presence of a short circuit between negative-terminal output voltage $V_{OUTP}$ of Class-D stage 32 and ground; (c) the presence of an abnormally large negative differential-mode voltage $V_{DM}$ and an abnormally large positive common-mode voltage $V_{CM}$ may indicate a presence of a short circuit between positive-terminal output voltage $V_{OUTP}$ of Class-D stage 32 and supply voltage $V_{SUPPLY}$; and (d) the presence of an abnormally large positive differential-mode voltage $V_{DM}$ and an abnormally large negative common-mode voltage $V_{CM}$ may indicate a presence of a short circuit between negative-terminal output voltage $V_{OUTP}$ of Class-D stage 32 and supply voltage $V_{SUPPLY}$.

| Voltage | Short circuit from: | | | |
|---|---|---|---|---|
| | $V_{OUTP}$ to Ground | $V_{OUTN}$ to Ground | $V_{OUTP}$ to $V_{SUPPLY}$ | $V_{OUTN}$ to $V_{SUPPLY}$ |
| $V_{SNS1}$ | — | — | $R_{SNS}(I_{OUT}+I_{SC})$ | — |
| $V_{SNS2}$ | — | — | — | $R_{SNS}(I_{OUT}+I_{SC})$ |
| $V_{SNSN}$ | — | — | $R_{SNS}(I_{OUT}+I_{SC})$ | $-R_{SNS}(I_{OUT}+\text{Isc})$ |
| $V_{SNS3}$ | $R_{SNS}(I_{OUT}+I_{SC})$ | — | — | — |
| $V_{SNS4}$ | — | $R_{SNS}(I_{OUT}+I_{SC})$ | — | — |
| $V_{SNSP}$ | $R_{SNS}(I_{OUT}+I_{SC})$ | $-R_{SNS}(I_{OUT}+I_{SC})$ | — | — |
| $V_{DM}$ | $R_{SNS}(I_{OUT}+I_{SC})$ | $-R_{SNS}(I_{OUT}+I_{SC})$ | $-R_{SNS}(I_{OUT}+I_{SC})$ | $R_{SNS}(I_{OUT}+I_{SC})$ |
| $V_{CM}$ | $R_{SNS}(I_{OUT}+I_{SC})$ | $-R_{SNS}(I_{OUT}+I_{SC})$ | $R_{SNS}(I_{OUT}+I_{SC})$ | $-R_{SNS}(I_{OUT}+I_{SC})$ |

In some embodiments, short-circuit detection circuitry 30 may include additional components other than AFEs 60, differential-mode combiner 64, and common-mode combiner 66 not explicitly shown in FIG. 6, including, without limitation, filters (e.g., anti-aliasing filters), an analog-to-digital converter, and/or other components.

While the architectures shown in FIGS. 4 and 6 utilize voltage-mode sensing of currents through switches of a Class-D stage, in some embodiments, current-mode sensing of currents may be used.

Figure 7:
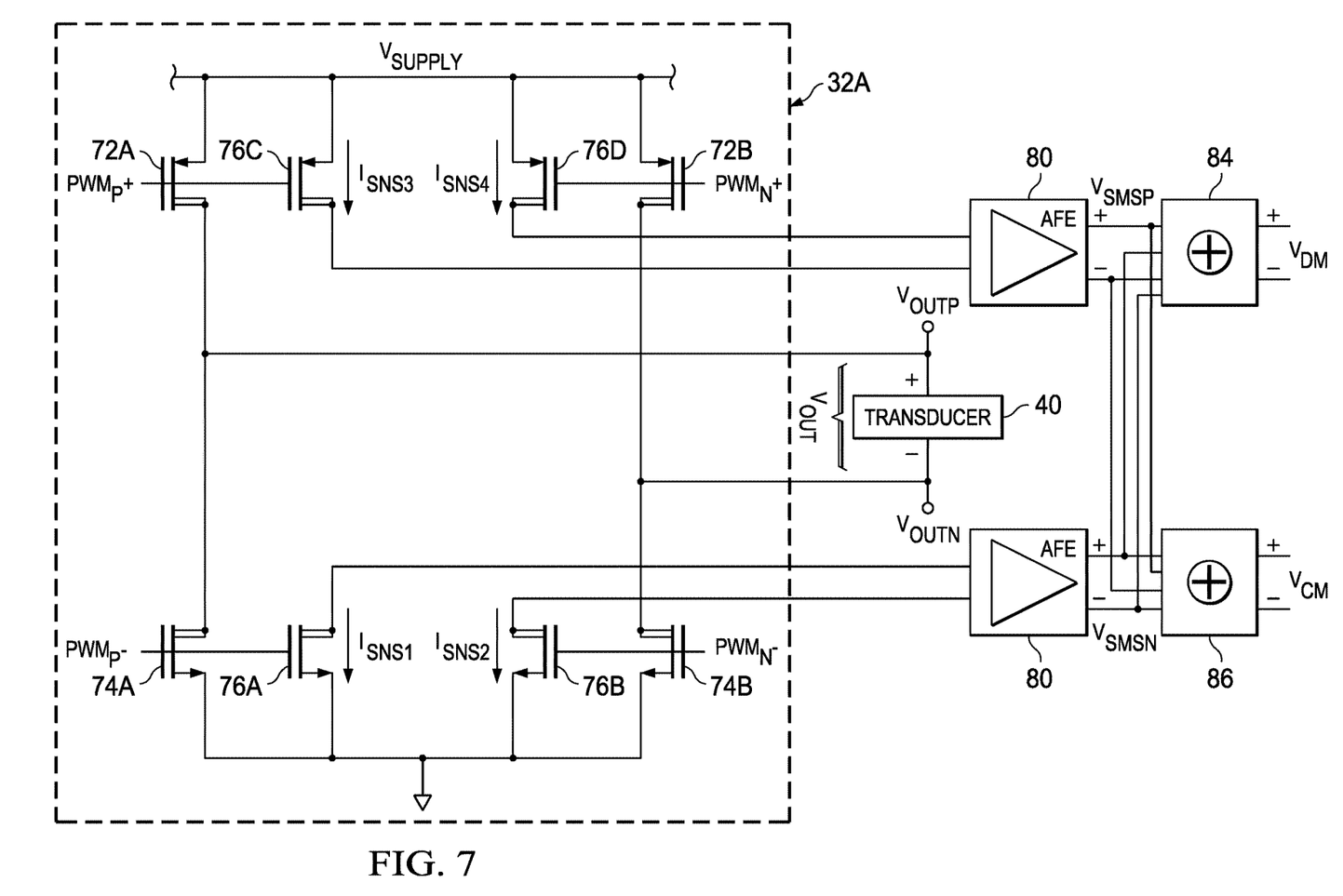
FIG. 7 illustrates a block and circuit diagram of selected components of an example Class-D stage, analog front ends, and combiners that may be used to implement short-circuit detection circuitry with current-mode sensing, in accordance with embodiments of the present disclosure.

FIG. 7 illustrates a block and circuit diagram of selected components of an example Class-D stage 32A, analog front ends (AFEs) 80, and combiners 84 and 86 that may be used to implement short-circuit detection circuitry 30 with current-mode sensing of currents, in accordance with embodiments of the present disclosure. In some embodiments, Class-D stage 32A may implement all or a portion of amplifier 26 described with respect to FIG. 3.

As shown in FIG. 7, Class-D stage 32A may drive output voltage $V_{OUT}$ (e.g., $V_{OUT}=V_{OUTP}-V_{OUTN}$, where $V_{OUTP}$ and $V_{OUTN}$ are a positive-terminal output voltage and a negative-terminal output voltage, respectively) to transducer 40 and may include a high-side switch 72A (e.g., implemented as a p-type field-effect transistor or "pFET") coupled to supply voltage $V_{SUPPLY}$ and a low-side switch 74A (e.g., implemented as an n-type field-effect transistor or "nFET") coupled to ground for driving a positive polarity output of Class-D stage 32A. High-side switch 72A and low-side switch 74A may be controlled by complementary pulse-width modulation signals $PWM_P^+$ and $PWM_P^-$, respectively. Class-D stage 32A may also include a high-side switch 72B (e.g., implemented as a pFET) coupled to supply voltage $V_{SUPPLY}$ and a low-side switch 74B (e.g., implemented as an nFET) coupled to ground for driving a negative polarity output of Class-D stage 32A. High-side switch 72B and low-side switch 74B may be controlled by complementary pulse-width modulation signals $PWM_N^+$ and $PWM_N^-$, respectively.

Further, low-side switch 74A may be common-gate-coupled and common-source-coupled to a sense transistor 76A (e.g., implemented as an nFET) such that a sense current $I_{SNS1}$ flowing through sense transistor 76A may be proportional to a current flowing through low-side switch 74A. Similarly, low-side switch 74B may be common-gate-coupled and common-source-coupled to a sense transistor 76B (e.g., implemented as an nFET) such that a sense current $I_{SNS2}$ flowing through sense transistor 76B may be proportional to a current flowing through low-side switch 74B.

In addition, high-side switch 72A may be common-gate-coupled and common-source-coupled to a sense transistor 76C (e.g., implemented as a pFET) such that a sense current $I_{SNS3}$ flowing through sense transistor 76C may be proportional to a current flowing through high-side switch 72A. Similarly, high-side switch 72B may be common-gate-coupled and common-source-coupled to a sense transistor 76D (e.g., implemented as a pFET) such that a sense current $I_{SNS4}$ flowing through sense transistor 76D may be proportional to a current flowing through high-side switch 72B.

In lieu of AFEs 60 generating differential output voltages $V_{SNSP}$ and $V_{SNSN}$ from sense voltages $V_{SNS1}$, $V_{SNS2}$, $V_{SNS3}$, and $V_{SNS4}$ as in the architectures of FIGS. 4 and 6, one AFE 80 may generate a differential output voltage $V_{SNSN}$ which is an amplified version of the difference between sense currents $I_{SNS1}$ and $I_{SNS2}$, while another AFE 80 may generate a differential output voltage $V_{SNSP}$ which is an amplified version of the difference between sense currents $I_{SNS3}$ and $I_{SNS4}$. Differential-mode combiner 84 may generate a differential-mode voltage $V_{DM}$ wherein $V_{DM}=V_{SNSP}-V_{SNSN}$ while common-mode combiner 86 may generate a common-mode voltage $V_{CM}$ wherein $V_{CM}=V_{SNSP}+V_{SNSN}$. Differential-mode voltage $V_{DM}$ and common-mode voltage $V_{CM}$ may be used in identical or similar manners to that of the architecture shown in FIG. 6 in order to detect the presence and/or location of a short circuit.

In some embodiments, short-circuit detection circuitry 30 may include additional components other than AFEs 80, differential-mode combiner 84, and common-mode combiner 86 not explicitly shown in FIG. 7, including, without limitation, filters (e.g., anti-aliasing filters), an analog-to-digital converter, and/or other components.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps.

Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a Class-D stage comprising:
      a first high-side switch coupled between a supply voltage and a first output terminal of the Class-D stage;
      a second high-side switch coupled between the supply voltage and a second output terminal of the Class-D stage;
      a first low-side switch coupled between a ground voltage and the first output terminal; and
      a second low-side switch coupled between the ground voltage and the second output terminal; and
   current sensing circuitry comprising:
      a first sensor coupled to the first high-side switch and configured to sense a first sense current associated with the first high-side switch, such that an output current through a load coupled between the first output terminal and the second output terminal is proportional to the first sense current when the first high-side switch is activated;
      a second sensor coupled to the second high-side switch and configured to sense a second sense current associated with the second high-side switch, such that the output current is proportional to the second sense current when the second high-side switch is activated;
      a third sensor coupled to the first low-side switch and configured to sense a third sense current associated with the first low-side switch, such that the output current is proportional to the third sense current when the first low-side switch is activated; and
      a fourth sensor coupled to the second low-side switch and configured to sense a fourth sense current associated with the second low-side switch, such that the output current is proportional to the fourth sense current when the second low-side switch is activated; and
   short-circuit detection circuitry configured to determine a presence and a location of a short circuit in the Class-D stage based on the first sense voltage, the second sense voltage, the third sense voltage, and the fourth sense voltage.

2. The system of claim 1, wherein:
   the first sensor comprises a first sense resistor coupled between the first high-side switch and the supply voltage, such that the output current causes a first sense voltage proportional to the output current across the first sense resistor when the first high-side switch is activated;
   the second sensor comprises a second sense resistor coupled between the second high-side switch and the supply voltage, such that the output current causes a second sense voltage proportional to the output current across the second sense resistor when the second high-side switch is activated;
   the third sensor comprises a third sense resistor coupled between the first low-side switch and the ground voltage, such that the output current causes a third sense voltage proportional to the output current across the third sense resistor when the first low-side switch is activated; and
   the fourth sensor comprises a fourth sense resistor coupled between the second low-side switch and the ground voltage, such that the output current causes a fourth sense voltage proportional to the output current across the fourth sense resistor when the second low-side switch is activated.

3. The system of claim 1, wherein:
   the first sensor comprises a first sense transistor common-gate coupled and common-source coupled to the first high-side switch, such that the first sense transistor generates the first sense current proportional to the output current when the first high-side switch is activated;
   the second sensor comprises a second sense transistor common-gate coupled and common-source coupled to the second high-side switch, such that the second sense transistor generates the second sense current proportional to the output current when the second high-side switch is activated;
   the third sensor comprises a third sense transistor common-gate coupled and common-source coupled to the first low-side switch, such that the third sense transistor generates the third sense current proportional to the output current when the first low-side switch is activated; and
   the fourth sensor comprises a fourth sense transistor common-gate coupled and common-source coupled to the second low-side switch, such that the fourth sense transistor generates the fourth sense current proportional to the output current when the second low-side switch is activated.

4. The system of claim 1, wherein the short-circuit detection circuitry comprises:
   a first analog-front end configured to amplify a difference between the first sense current and the second sense current to generate a first combined sense voltage; and
   a second analog-front end configured to amplify a difference between the third sense current and the fourth sense current to generate a second combined sense voltage;

wherein the short-circuit detection circuitry is configured to determine the presence and the location of the short circuit in the Class-D stage based on the first combined sense voltage and the second combined sense voltage.

5. The system of claim 4, wherein the short-circuit detection circuitry further comprises:
a differential-mode combiner configured to generate a differential-mode voltage equal to a difference between the first combined sense voltage and the second combined sense voltage; and
a common-mode combiner configured to generate a common-mode voltage equal to a sum of the first combined sense voltage and the second combined sense voltage;
wherein the short-circuit detection circuitry is configured to determine the presence and the location of the short circuit in the Class-D stage based on the differential-mode voltage and the common-mode voltage.

6. A method, in a system comprising a Class-D stage having a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal, the method comprising:
measuring a first sense current associated with the first high-side switch with a first sensor coupled to the first high-side switch, such that an output current through a load coupled between the first output terminal and the second output terminal is proportional to the first sense current when the first high-side switch is activated;
measuring a second sense current associated with the second high-side switch with a second sensor coupled to the second high-side switch, such that the output current is proportional to the second sense current when the second high-side switch is activated;
measuring a third sense current associated with the first low-side switch with a third sensor coupled to the first low-side switch, such that the output current is proportional to the third sense current when the first low-side switch is activated;
measuring a fourth sense current associated with the second low-side switch with a fourth sensor coupled to the second low-side switch, such that the output current is proportional to the fourth sense current when the second low-side switch is activated; and
determining a presence and a location of a short circuit in the Class-D stage based on the first sense voltage, the second sense voltage, the third sense voltage, and the fourth sense voltage.

7. The method of claim 6, wherein:
the first sensor comprises a first sense resistor coupled between the first high-side switch and the supply voltage, such that the output current causes a first sense voltage proportional to the output current across the first sense resistor when the first high-side switch is activated;
the second sensor comprises a second sense resistor coupled between the second high-side switch and the supply voltage, such that the output current causes a second sense voltage proportional to the output current across the second sense resistor when the second high-side switch is activated;
the third sensor comprises a third sense resistor coupled between the first low-side switch and the ground voltage, such that the output current causes a third sense voltage proportional to the output current across the third sense resistor when the first low-side switch is activated; and
the fourth sensor comprises a fourth sense resistor coupled between the second low-side switch and the ground voltage, such that the output current causes a fourth sense voltage proportional to the output current across the fourth sense resistor when the second low-side switch is activated.

8. The method of claim 6, wherein:
the first sensor comprises a first sense transistor common-gate coupled and common-source coupled to the first high-side switch, such that the first sense transistor generates the first sense current proportional to the output current when the first high-side switch is activated;
the second sensor comprises a second sense transistor common-gate coupled and common-source coupled to the second high-side switch, such that the second sense transistor generates the second sense current proportional to the output current when the second high-side switch is activated;
the third sensor comprises a third sense transistor common-gate coupled and common-source coupled to the first low-side switch, such that the third sense transistor generates the third sense current proportional to the output current when the first low-side switch is activated; and
the fourth sensor comprises a fourth sense transistor common-gate coupled and common-source coupled to the second low-side switch, such that the fourth sense transistor generates the fourth sense current proportional to the output current when the second low-side switch is activated.

9. The method of claim 6, wherein determining the presence and the location of a short circuit in the Class-D stage comprises:
amplifying a difference between the first sense current and the second sense current to generate a first combined sense voltage; and
amplifying a difference between the third sense current and the fourth sense current to generate a second combined sense voltage; and
determining the presence and the location of the short circuit in the Class-D stage based on the first combined sense voltage and the second combined sense voltage.

10. The method of claim 9, wherein determining the presence and the location of a short circuit in the Class-D stage comprises:
generating a differential-mode voltage equal to a difference between the first combined sense voltage and the second combined sense voltage; and
generating a common-mode voltage equal to a sum of the first combined sense voltage and the second combined sense voltage;
determining the presence and the location of the short circuit in the Class-D stage based on the differential-mode voltage and the common-mode voltage.

11. A device comprising:
an output transducer;
a Class-D stage coupled to the output transducer via a first output terminal and a second output terminal of the Class-D stage and configured to drive the output transducer, the Class-D stage comprising:
a first high-side switch coupled between a supply voltage and a first output terminal of the Class-D stage;

a second high-side switch coupled between the supply voltage and a second output terminal of the Class-D stage;
a first low-side switch coupled between a ground voltage and the first output terminal; and
a second low-side switch coupled between the ground voltage and the second output terminal; and
current sensing circuitry comprising:
a first sensor coupled to the first high-side switch and configured to sense a first sense current associated with the first high-side switch, such that an output current through a load coupled between the first output terminal and the second output terminal is proportional to the first sense current when the first high-side switch is activated;
a second sensor coupled to the second high-side switch and configured to sense a second sense current associated with the second high-side switch, such that the output current is proportional to the second sense current when the second high-side switch is activated;
a third sensor coupled to the first low-side switch and configured to sense a third sense current associated with the first low-side switch, such that the output current is proportional to the third sense current when the first low-side switch is activated; and
a fourth sensor coupled to the second low-side switch and configured to sense a fourth sense current associated with the second low-side switch, such that the output current is proportional to the fourth sense current when the second low-side switch is activated; and
short-circuit detection circuitry configured to determine a presence and a location of a short circuit in the Class-D stage based on the first sense voltage, the second sense voltage, the third sense voltage, and the fourth sense voltage.

12. The device of claim 11, wherein:
the first sensor comprises a first sense resistor coupled between the first high-side switch and the supply voltage, such that the output current causes a first sense voltage proportional to the output current across the first sense resistor when the first high-side switch is activated;
the second sensor comprises a second sense resistor coupled between the second high-side switch and the supply voltage, such that the output current causes a second sense voltage proportional to the output current across the second sense resistor when the second high-side switch is activated;
the third sensor comprises a third sense resistor coupled between the first low-side switch and the ground voltage, such that the output current causes a third sense voltage proportional to the output current across the third sense resistor when the first low-side switch is activated; and
the fourth sensor comprises a fourth sense resistor coupled between the second low-side switch and the ground voltage, such that the output current causes a fourth sense voltage proportional to the output current across the fourth sense resistor when the second low-side switch is activated.

13. The device of claim 11, wherein:
the first sensor comprises a first sense transistor common-gate coupled and common-source coupled to the first high-side switch, such that the first sense transistor generates the first sense current proportional to the output current when the first high-side switch is activated;
the second sensor comprises a second sense transistor common-gate coupled and common-source coupled to the second high-side switch, such that the second sense transistor generates the second sense current proportional to the output current when the second high-side switch is activated;
the third sensor comprises a third sense transistor common-gate coupled and common-source coupled to the first low-side switch, such that the third sense transistor generates the third sense current proportional to the output current when the first low-side switch is activated; and
the fourth sensor comprises a fourth sense transistor common-gate coupled and common-source coupled to the second low-side switch, such that the fourth sense transistor generates the fourth sense current proportional to the output current when the second low-side switch is activated.

14. The device of claim 11, wherein the short-circuit detection circuitry comprises:
a first analog-front end configured to amplify a difference between the first sense current and the second sense current to generate a first combined sense voltage; and
a second analog-front end configured to amplify a difference between the third sense current and the fourth sense current to generate a second combined sense voltage;
wherein the short-circuit detection circuitry is configured to determine the presence and the location of the short circuit in the Class-D stage based on the first combined sense voltage and the second combined sense voltage.

15. The device of claim 14, wherein the short-circuit detection circuitry further comprises:
a differential-mode combiner configured to generate a differential-mode voltage equal to a difference between the first combined sense voltage and the second combined sense voltage; and
a common-mode combiner configured to generate a common-mode voltage equal to a sum of the first combined sense voltage and the second combined sense voltage;
wherein the short-circuit detection circuitry is configured to determine the presence and the location of the short circuit in the Class-D stage based on the differential-mode voltage and the common-mode voltage.

16. A system for detecting a short circuit in a Class-D stage comprising a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal, the system comprising:
current sensing circuitry comprising:
a first sensor coupled to the first high-side switch and configured to sense a first sense current associated with the first high-side switch, such that an output current through a load coupled between the first output terminal and the second output terminal is proportional to the first sense current when the first high-side switch is activated;
a second sensor coupled to the second high-side switch and configured to sense a second sense current associated with the second high-side switch, such that the output current is proportional to the second sense current when the second high-side switch is activated;

a third sensor coupled to the first low-side switch and configured to sense a third sense current associated with the first low-side switch, such that the output current is proportional to the third sense current when the first low-side switch is activated; and a fourth sensor coupled to the second low-side switch and configured to sense a fourth sense current associated with the second low-side switch, such that the output current is proportional to the fourth sense current when the second low-side switch is activated; and short-circuit detection circuitry configured to determine a presence and a location of a short circuit in the Class-D stage based on the first sense voltage, the second sense voltage, the third sense voltage, and the fourth sense voltage.

17. The system of claim 16, wherein:

the first sensor comprises a first sense resistor coupled between the first high-side switch and the supply voltage, such that the output current causes a first sense voltage proportional to the output current across the first sense resistor when the first high-side switch is activated;

the second sensor comprises a second sense resistor coupled between the second high-side switch and the supply voltage, such that the output current causes a second sense voltage proportional to the output current across the second sense resistor when the second high-side switch is activated;

the third sensor comprises a third sense resistor coupled between the first low-side switch and the ground voltage, such that the output current causes a third sense voltage proportional to the output current across the third sense resistor when the first low-side switch is activated; and the fourth sensor comprises a fourth sense resistor coupled between the second low-side switch and the ground voltage, such that the output current causes a fourth sense voltage proportional to the output current across the fourth sense resistor when the second low-side switch is activated.

18. The system of claim 16, wherein:

the first sensor comprises a first sense transistor common-gate coupled and common-source coupled to the first high-side switch, such that the first sense transistor generates the first sense current proportional to the output current when the first high-side switch is activated;

the second sensor comprises a second sense transistor common-gate coupled and common-source coupled to the second high-side switch, such that the second sense transistor generates the second sense current proportional to the output current when the second high-side switch is activated;

the third sensor comprises a third sense transistor common-gate coupled and common-source coupled to the first low-side switch, such that the third sense transistor generates the third sense current proportional to the output current when the first low-side switch is activated; and the fourth sensor comprises a fourth sense transistor common-gate coupled and common-source coupled to the second low-side switch, such that the fourth sense transistor generates the fourth sense current proportional to the output current when the second low-side switch is activated.

19. The system of claim 16, wherein the short-circuit detection circuitry comprises:

a first analog-front end configured to amplify a difference between the first sense current and the second sense current to generate a first combined sense voltage; and a second analog-front end configured to amplify a difference between the third sense current and the fourth sense current to generate a second combined sense voltage;

wherein the short-circuit detection circuitry is configured to determine the presence and the location of the short circuit in the Class-D stage based on the first combined sense voltage and the second combined sense voltage.

20. The system of claim 19, wherein the short-circuit detection circuitry further comprises:

a differential-mode combiner configured to generate a differential-mode voltage equal to a difference between the first combined sense voltage and the second combined sense voltage; and a common-mode combiner configured to generate a common-mode voltage equal to a sum of the first combined sense voltage and the second combined sense voltage;

wherein the short-circuit detection circuitry is configured to determine the presence and the location of the short circuit in the Class-D stage based on the differential-mode voltage and the common-mode voltage.

* * * * *